(12) United States Patent
Sato et al.

(10) Patent No.: US 9,567,467 B2
(45) Date of Patent: Feb. 14, 2017

(54) THERMAL SPRAY COATING, MEMBER FOR SEMICONDUCTOR MANUFACTURING EQUIPMENT, FEEDSTOCK MATERIAL FOR THERMAL SPRAY, AND METHOD FOR PRODUCING THERMAL SPRAY COATING

(71) Applicant: NGK Insulators, Ltd., Nagoya (JP)

(72) Inventors: Yosuke Sato, Hashima-Gun (JP); Katsuhiro Inoue, Tsushima (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 20 days.

(21) Appl. No.: 14/557,801

(22) Filed: Dec. 2, 2014

(65) Prior Publication Data

US 2015/0159020 A1 Jun. 11, 2015

(30) Foreign Application Priority Data

Dec. 6, 2013 (JP) .................................. 2013-252766
May 27, 2014 (JP) .................................. 2014-109328

(51) Int. Cl.
| | | |
|---|---|---|
| C08K 3/22 | (2006.01) | |
| C08K 3/28 | (2006.01) | |
| C09D 1/00 | (2006.01) | |
| C04B 35/053 | (2006.01) | |
| C04B 35/622 | (2006.01) | |
| C04B 35/645 | (2006.01) | |
| C23C 4/10 | (2016.01) | |

(52) U.S. Cl.
CPC .............. *C09D 1/00* (2013.01); *C04B 35/053* (2013.01); *C04B 35/62222* (2013.01); *C04B 35/645* (2013.01); *C23C 4/10* (2013.01); *C04B 2235/3206* (2013.01); *C04B 2235/3217* (2013.01); *C04B 2235/3222* (2013.01); *C04B 2235/3865* (2013.01); *C04B 2235/3869* (2013.01); *C04B 2235/6567* (2013.01); *C04B 2235/6586* (2013.01); *C04B 2235/76* (2013.01); *C04B 2235/80* (2013.01)

(58) Field of Classification Search
None
See application file for complete search history.

(56) References Cited

U.S. PATENT DOCUMENTS

| | | | | |
|---|---|---|---|---|
| 2009/0311145 A1* | 12/2009 | Wu | ........................... | C23C 4/18 422/129 |
| 2010/0272982 A1* | 10/2010 | Dickinson | ................. | C23C 4/02 428/304.4 |
| 2012/0231945 A1 | 9/2012 | Watanabe et al. | | |

FOREIGN PATENT DOCUMENTS

WO 2012/056876 A1 5/2012

* cited by examiner

*Primary Examiner* — Colin W Slifka
(74) *Attorney, Agent, or Firm* — Burr & Brown, PLLC

(57) ABSTRACT

A thermal spray coating according to the present invention contains mainly magnesium, aluminum, oxygen, and nitrogen and has, as a main phase, a crystal phase of a MgO—AlN solid solution in which aluminum nitride is dissolved with magnesium oxide. The thermal spray coating is obtained by thermal spray of powder of a ceramic material containing mainly magnesium, aluminum, oxygen, and nitrogen and having, as a main phase, a crystal phase of a MgO—AlN solid solution in which aluminum nitride is dissolved with magnesium oxide.

10 Claims, 4 Drawing Sheets

THERMAL SPRAY COATING, MEMBER FOR SEMICONDUCTOR MANUFACTURING EQUIPMENT, FEEDSTOCK MATERIAL FOR THERMAL SPRAY, AND METHOD FOR PRODUCING THERMAL SPRAY COATING

BACKGROUND OF THE INVENTION

1. Field of the Invention

The present invention relates to a thermal spray coating, a member for semiconductor manufacturing equipment, a feedstock material for thermal spray, and a method for producing a thermal spray coating.

2. Description of the Related Art

In semiconductor manufacturing equipment used for dry processes, plasma coating, and the like in semiconductor manufacturing, a halogen-based plasma, such as F or Cl, having high reactivity and corrosiveness is used for etching and cleaning. Members assembled into such semiconductor manufacturing equipment are required to have high corrosion resistance. In materials for such members, long-term use causes corrosion to progress gradually, and occurrence of dust and the like results in contamination of semiconductors. Thus, high corrosion resistance is needed. Alumina, aluminum nitride, yttria, and the like are known as materials having high corrosion resistance, and have been used in semiconductor manufacturing equipment. As a material having higher corrosion resistance than such materials, the present inventors have developed a ceramic material containing mainly magnesium, aluminum, oxygen, and nitrogen and having, as a main phase, a crystal phase of a MgO—AlN solid solution in which aluminum nitride is dissolved with magnesium oxide (PTL 1). This material has very high corrosion resistance and a smaller water-absorbing capacity than magnesium oxide, and exhibits high denseness and a good insulating property as a bulk. Therefore, it is believed that the ceramic material is very suitably used for members, such as heaters and electrostatic chucks, in semiconductor manufacturing equipment.

CITATION LIST

Patent Literature

[PTL 1] International Publication Pamphlet No. WO2012/56876

SUMMARY OF THE INVENTION

When use is intended for various members employed in semiconductor manufacturing equipment, a technique has been proposed in which a thermal spray coating having high corrosion resistance is formed on the surface of a given substrate to improve corrosion resistance of the member. For example, coatings of alumina or yttria are used for inner surfaces of chambers and the like for semiconductor manufacturing equipment.

However, regarding the ceramic material of PTL 1, no studies have been conducted on thermal spray coatings. It is not known if a thermal spray coating can be obtained, and corrosion resistance thereof has not been determined. Furthermore, for pure magnesium oxide, which is a material having corrosion resistance equivalent to the ceramic material, it is very difficult to select thermal spray conditions which permit melting while not permitting volatilization. Moreover, since magnesium oxide is hygroscopic and water-absorbing, when it is used for members which are to be subjected to a vacuum or reduced pressure, the generation of water may pose a problem.

The present invention has been achieved to solve such problems. It is a main object of the present invention to provide a thermal spray coating that has high corrosion resistance and low water absorption for a highly reactive halogen-based plasma in semiconductor manufacturing.

Means for Solving the Problems

The present inventors have conducted a study in which a ceramic material obtained by forming and then hot-press sintering mixed powder of magnesium oxide, aluminum oxide, and aluminum nitride, is pulverized, a thermal spray coating is formed using the pulverized material as a feedstock material for thermal spray, and the corrosion resistance of the thermal spray coating is checked, and have found that the thermal spray coating has excellent corrosion resistance. Furthermore, it has been found that, when the feedstock material for thermal spray used for forming the thermal spray coating is compared with magnesium oxide powder, a thermal spray coating is more easily formed using the feedstock material than using magnesium oxide powder under the substantially same thermal spray conditions, such as energy and the amount of feedstock supply. Thus, the present inventors have completed the present invention.

That is, a thermal spray coating according to the present invention has, as a main phase, a crystal phase of a MgO—AlN solid solution in which aluminum nitride is dissolved with magnesium oxide.

Furthermore, a feedstock material for thermal spray according to the present invention is powder of a ceramic material having, as a main phase, a crystal phase of a MgO—AlN solid solution in which aluminum nitride is dissolved with magnesium oxide.

A method for producing a thermal spray coating according to the present invention includes forming a thermal spray coating by plasma spray of such a feedstock material for thermal spray.

DESCRIPTION OF THE PREFERRED EMBODIMENTS

Figure 1:
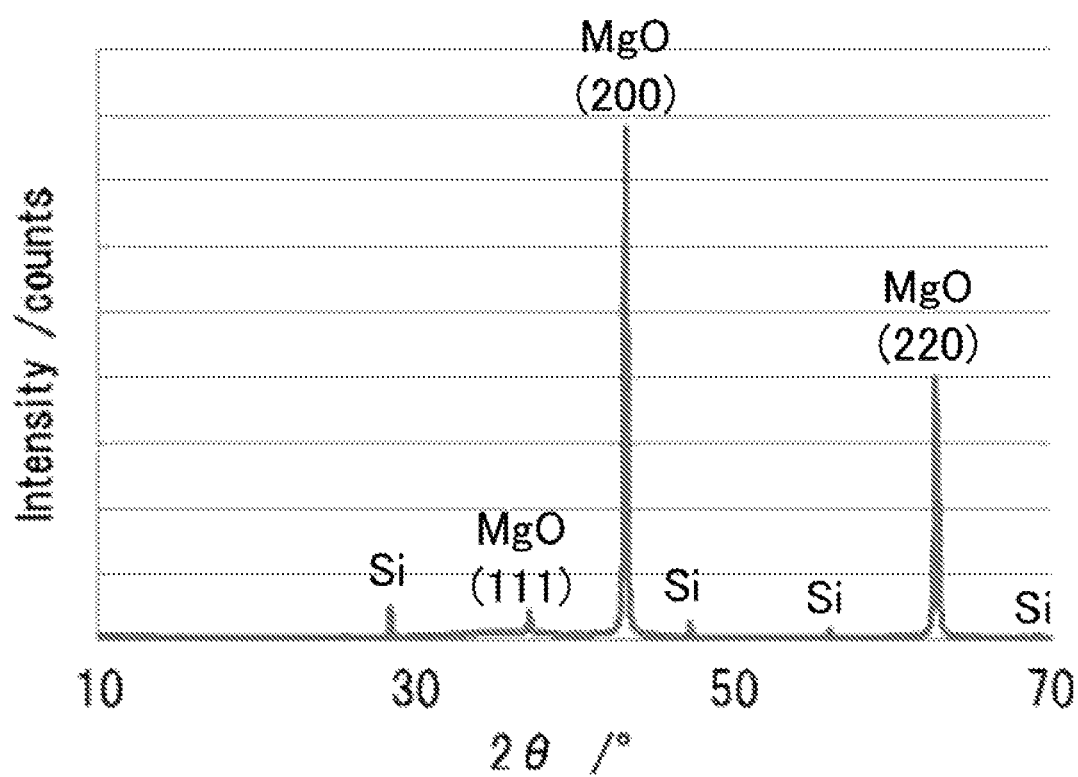
FIG. 1 is an XRD analysis chart of a feedstock material for thermal spray in Experimental Example 2.

A thermal spray coating according to the present invention has, as a main phase, a crystal phase of a MgO—AlN solid solution in which an aluminum nitride component is dissolved with magnesium oxide. The term "main phase" refers to the fact that the ratio of the number of moles of the Mg element to the total number of moles of metal elements in the thermal spray coating (Mg/(Mg+Al) molar ratio) is 0.5 or more. The method of thermal spray is not particularly limited as long as the feedstock material is melted, and for example, plasma spray is used. The MgO—AlN solid solution has corrosion resistance equivalent to magnesium oxide and has higher moisture resistance and water resistance than magnesium oxide. Therefore, it is believed that the thermal spray coating having, as the main phase, the crystal phase of the MgO—AlN solid solution also has high corrosion resistance, moisture resistance, and water resistance.

In the thermal spray coating of the present invention, preferably, the XRD peak of the MgO (200) plane measured with CuKα radiation shifts to a higher angle side with respect to 2θ=42.90°, which corresponds to the peak of the cubic crystal of magnesium oxide. As the dissolution amounts of aluminum and nitrogen increase, the XRD peak of magnesium oxide shifts to the higher angle side, and water resistance improves. Furthermore, preferably, the XRD peak of the MgO (111) plane shifts to a higher angle side with respect to 2θ=36.90°, which corresponds to the peak of the cubic crystal of magnesium oxide. Furthermore, preferably, the XRD peak of the MgO (220) plane shifts to a higher angle side with respect to 2θ=62.30°, which corresponds to the peak of the cubic crystal of magnesium oxide.

In the thermal spray coating of the present invention, preferably, the full width at half maximum of the XRD peak of the MgO (200) plane measured with CuKα radiation is 0.55° or less. The reason for this is that, in general, there is a tendency that as the full width at half maximum decreases, crystallinity increases and corrosion resistance also increases.

In the thermal spray coating of the present invention, in component analysis, the Mg/(Mg+Al) molar ratio is preferably 0.58 or more. The reason for this is that in a material containing mainly magnesium, aluminum, oxygen, and nitrogen and having, as a main phase, a crystal phase of a MgO—AlN solid solution in which aluminum nitride is dissolved with magnesium oxide, as the percentage of Mg increases, corrosion resistance increases. The upper limit of the Mg/(Mg+Al) molar ratio is not particularly limited, but is preferably 0.90 or less. When the molar ratio exceeds 0.90, there is a concern that the thermal spray coating may be unlikely to be obtained or water absorption may increase to a certain extent.

However, it is believed that the corrosion resistance of the thermal spray coating is determined by a complex combination of other factors, such as the porosity of the thermal spray coating, in addition to the full width at half maximum and the Mg/(Mg+Al) molar ratio described above.

The thermal spray coating of the present invention may contain, as a subphase, a magnesium aluminum oxide. Since the magnesium aluminum oxide also has high corrosion resistance, there is no problem even if it is included as the subphase. Examples of the magnesium aluminum oxide include spinel ($MgAl_2O_4$).

The thermal spray coating of the present invention may contain, as a subphase, a magnesium-aluminum oxynitride phase whose XRD peak measured with CuKα radiation appears at, at least, 2θ=47° to 49°. Since the magnesium-aluminum oxynitride also has high corrosion resistance, there is no problem even if it is included as the subphase.

Preferably, the thermal spray coating of the present invention has an open porosity of 20% or less. Herein, any method can be used to determine the open porosity. For example, the Archimedean method using pure water as a medium, or a method in which the open porosity is determined from the area fraction between the film and pores obtained by image processing of a photograph of a cross section of the film, may be used. When the open porosity exceeds 20%, there is a concern that the strength of the thermal spray coating may be decreased, or shattering of the material may cause occurrence of dust, and furthermore, there is a concern that a halogen-based plasma having high corrosiveness may corrode a substrate portion having low corrosion resistance, which is not desirable. Furthermore, the open porosity is preferably close to zero as much as possible. Therefore, the lower limit is not particularly present.

The thermal spray coating of the present invention can be used as a coating that covers the surface of a member for semiconductor manufacturing equipment. Examples of the member for semiconductor manufacturing equipment include electrostatic chucks, susceptors, heaters, plates, chambers, inner wall materials, monitoring windows, microwave-introducing windows, and microwave coupling antennas. These members are required to have excellent corrosion resistance against the plasma of halogen element-containing corrosive gas. Therefore, coating with the thermal spray coating of the present invention is preferable.

A feedstock material for thermal spray according to the present invention is powder of a ceramic material containing mainly magnesium, aluminum, oxygen, and nitrogen and having, as a main phase, a crystal phase of a MgO—AlN solid solution in which aluminum nitride is dissolved with magnesium oxide. Such a ceramic material can be produced by forming and then sintering mixed powder of magnesium oxide, aluminum nitride, and alumina. As the mixed powder, for example, a mixture of 44.0% to 97.5% by mass of magnesium oxide, 0.8% to 51.0% by mass of aluminum nitride, and 1.7% to 56.0% by mass of aluminum oxide is preferable. The sintering temperature is preferably 1,700° C. or higher, more preferably 1,800° C. or higher, and still more preferably 1,825° C. or higher. The upper limit of the sintering temperature is not particularly limited, and for example, may be set at 1,850° C. Furthermore, in the sintering process, for example, hot-press sintering may be employed. The pressing pressure during hot-press sintering is preferably set at 50 to 300 kgf/cm². The atmosphere during sintering is preferably an atmosphere that does not affect sintering of the oxide materials, and is preferably an inert atmosphere, such as a nitrogen atmosphere, an argon atmosphere, or a helium atmosphere. The pressure during forming is not particularly limited, and may be appropriately set to a pressure capable of maintaining the shape. By pulverizing the ceramic material obtained by sintering into powder, the feedstock material for thermal spray of the present invention is obtained. The pulverization method is not particularly limited. Examples of the pulverization method include dry or wet methods using a stamp mill, a ball mill, a jet mill, a bead mill, a roll mill, a hammer mill, a jaw crusher, or a vibration mill, and a plurality of these methods may be used in combination for pulverization. The method of particle size control for the feedstock material for thermal spray is not particularly limited as long as the pulverized material can be classified. Furthermore, pulverization and classification may be performed simultaneously. Examples of the classification method include dry or wet gravitational classification, inertial classification, centrifugal classification, and sieving classification methods, and a plurality of these methods may be used in combination for classification.

In the feedstock material for thermal spray according to the present invention, preferably, the XRD peak of the MgO (200) plane measured with CuKα radiation shifts to a higher angle side with respect to 2θ=42.90°, which corresponds to the peak of the cubic crystal of magnesium oxide. As the dissolution amounts of aluminum and nitrogen increase, the XRD peak of magnesium oxide shifts to the higher angle side, and water resistance improves. Furthermore, preferably, the XRD peak of the MgO (111) plane shifts to a higher angle side with respect to 2θ=36.90°, which corresponds to the peak of the cubic crystal of magnesium oxide. Furthermore, preferably, the XRD peak of the MgO (220) plane shifts to a higher angle side with respect to 2θ=62.30°, which corresponds to the peak of the cubic crystal of magnesium oxide.

In the feedstock material for thermal spray according to the present invention, in component analysis, the Mg/(Mg+Al) molar ratio is preferably 0.62 or more. In such a case, corrosion resistance can be increased.

The feedstock material for thermal spray according to the present invention may contain, as a subphase, a magnesium aluminum oxide. Since the magnesium aluminum oxide also has high corrosion resistance, there is no problem even if it is included as the subphase. Examples of the magnesium aluminum oxide include spinel ($MgAl_2O_4$).

The feedstock material for thermal spray according to the present invention may contain, as a subphase, a magnesium-aluminum oxynitride phase whose XRD peak measured with CuKα radiation appears at, at least, 2θ=47° to 49°. Since the magnesium-aluminum oxynitride also has high corrosion resistance, there is no problem even if it is included as the subphase.

The feedstock material for thermal spray according to the present invention preferably contains 1.5% by mass or more of Al and preferably contains 0.3% by mass or more of N. In such a case, a thermal spray coating is likely to be formed on pure magnesium oxide, and the water resistance of the resulting thermal spray coating improves compared with that of pure magnesium oxide.

In the feedstock material for thermal spray according to the present invention, in particle size distribution measurement, preferably, D10 is 1 μm or more, and D90 is 200 μm or less. When D10 is smaller than this range, it is difficult to stably supply powder with a dry-type powder feeder for thermal spray. When D90 is larger than this range, pores are likely to remain between molten particles in the resulting thermal spray coating.

A method for producing a thermal spray coating according to the present invention includes forming a thermal spray coating by thermal spray using the feedstock material for thermal spray described above. The method of thermal spray is not particularly limited as long as the feedstock material is melted, and for example, plasma spray is used. The plasma gas is not particularly limited, and for example, argon, helium, nitrogen, hydrogen, oxygen, or a combination of two or more thereof can be used. Thermal spray conditions are not particularly limited, and may be appropriately set depending on the feedstock material for thermal spray, the substrate for thermal spray (substrate to be coated with the thermal spray coating), and the like.

EXAMPLES

Regarding feedstock materials for thermal spray, Experimental Examples 1 to 3 and 2a correspond to examples, and Experimental Example 4 corresponds to a comparative example. Furthermore, regarding thermal spray coatings, Experimental Examples 1-1, 1-2, and 1-3, Experimental Examples 2-1, 2-2, and 2-3, and Experimental Examples 3-1 and 3-2 correspond to examples, and Experimental Examples 4-1, 4-2, and 4-3 correspond to comparative examples.

Experimental Examples 1 to 3 and 2a

In Experimental Examples 1 to 3 and 2a, commercially available MgO material (purity 99.9% by mass or more, average particle size 3 μm), $Al_2O_3$ material (purity 99.9% by mass or more, average particle size 0.5 μm), and AlN material (purity 99.9% by mass or more, average particle size 1 μm or less) were used. The AlN material unavoidably contains about 1% by mass of oxygen, and therefore, in the purity of the AlN material, impurity elements exclude oxygen.

(Production of Feedstock Material for Thermal Spray)

Feedstock materials for thermal spray were produced by the method described below.

Preparation Step

The MgO material, $Al_2O_3$ material, and AlN material were each weighed so as to satisfy the mass % shown in Table 1, and wet mixing was performed for 4 hours, using isopropyl alcohol as a solvent, in a nylon pot, using nylon balls, with a diameter of 20 mm, having an iron core, as milling balls. After the mixing, a slurry was taken out, dried under nitrogen stream at 110° C., and then passed through a 30-mesh sieve to obtain mixed powder.

Forming Step

The mixed powder was subjected to uniaxial pressing at a pressure of 100 kgf/cm² to form a disc-like formed body.

Sintering Step

The disc-like formed body was placed in a graphite mold for sintering, and hot-press sintering was performed to thereby obtain a ceramic material. In the hot-press sintering process, the pressing pressure was set at 200 kgf/cm², and sintering was performed at the sintering temperature (maximum temperature) shown in Table 1. A $N_2$ atmosphere was maintained until the end of sintering. The holding time at the sintering temperature was set at 4 hours.

Pulverization Step

The resulting sintered body was pulverized with a stamp mill, and the pulverized material was passed through a sieve with an opening of 75 μm and a sieve with an opening of 32 μm. Powder under the 75-μm sieve and over the 32-μm sieve was used as the feedstock material for thermal spray in each of Experimental Example 1, Experimental Example 2, and Experimental Example 3. The pulverized material was passed through a sieve with an opening of 45 μm and a sieve with an opening of 25 μm, and powder under the 45-μm sieve and over the 25-μm sieve was used as the feedstock material for thermal spray in Experimental Example 2a. Furthermore, as the feedstock material for thermal spray in Experimental Example 4, a commercially available MgO material was prepared.

(Evaluation of Feedstock Material for Thermal Spray)

1) XRD Measurement

Crystal phases were identified with an X-ray diffractometer. The measurement was performed under the conditions of CuKα, 40 kV, 40 mA, and 2θ=10° to 70°, using a sealed tube-type X-ray diffractometer (D8 ADVANCE, manufactured by Bruker AXS). The step width of the measurement was 0.02°. In order to determine the diffraction angle at the peak top, by adding Si standard sample powder (SRM640C) manufactured by NIST, the peak position was corrected. The diffraction angle at the peak top of the (200) plane of magnesium oxide was set to be the value of ICDD78-0430. For each feedstock material for thermal spray, after confirming the detection of diffraction peaks at the vicinity of the MgO (111) plane, (200) plane, and (220) plane as shown in ICDD78-0430, the peak of the diffraction angle of the (200) plane was obtained. Furthermore, the full width at half maximum of the peak of the (200) plane was calculated, which was used as the index of crystallinity. Here, the full width at half maximum was calculated for each of the peaks of angles obtained by means of the peak search function of commercially available software JADE 7 manufactured by MDI. Peak search conditions of JADE 7 were as follows: type of filter: variable, parabolic filter; definition of peak position: peak top; as for the threshold and range, threshold σ=3.0, peak intensity (%) cutoff=0.1, range of BG determination=1.0; BG averaging 7 points; elimination of Kα2 peak: ON, and elimination of existing peak list: ON.

2) Component Analysis

The resulting powder was subjected to chemical analysis. After a sample was dissolved, analysis of each of Mg and Al was carried out by chelate titration, and analysis of N was carried out by an inert gas fusion-thermal conductivity detection technique. Although analysis of O was not carried out, it is believed that the remainder, excluding unavoidable components, such as impurities and contaminants, is substantially composed of O.

3) Particle Size Distribution

The particle size distribution of the resulting powder was determined. Measurement was performed using a Microtrac MT3300EX II manufactured by Nikkiso Co., Ltd., and cumulative particle size distributions 10% (D10) and 90% (D90) were determined.

4) Constituent Elements

Constituent elements were identified by EPMA measurement. Because of difficulty in measurement in the form of powder, a cross section of each ceramic material before pulverization was mirror-polished, and detection and identification of constituent elements were performed.

5) Corrosion Resistance Test

Each sintered body before being pulverized into a feedstock material for thermal spray (sintered body after the sintering step before the pulverization step) was mirror-polished, partially masked, and a corrosion resistance test was performed with an inductively coupled plasma (ICP) corrosion resistance tester under the conditions described below. The difference in level between the masked surface and the exposed surface, which was measured with a step gauge, was divided by the testing time to calculate the etch rate of each material.

ICP: 800 W, bias: 450 W, introduced gas: $NF_3/O_2/Ar=75/35/140$ sccm at 0.05 Torr, exposure time: 5 h, sample temperature: room temperature.

6) Porosity

The porosity of each sintered body before being pulverized into a feedstock material for thermal spray was measured by the Archimedean method using pure water as a medium.

TABLE 1

| | Material powder (Before sintering) | | | Sintering | Feedstock material for thermal spray (After sintering) | | | |
|---|---|---|---|---|---|---|---|---|
| | | | | | Crystal phase*[1] | | Peak top | Full width at half maximum |
| | MgO wt % | $Al_2O_3$ wt % | AlN wt % | temperature °C. | Main phase | Subphase | MgO(200) | MgO(200) |
| Experimental example 1 | 85.1 | 11.2 | 3.7 | 1825 | MgOss | Not confirmed | 43.10° | 0.18 |
| Experimental example 2 | 77.0 | 17.3 | 5.7 | 1825 | MgOss | Not confirmed | 43.24° | 0.20 |
| Experimental example 2a | 77.0 | 17.3 | 5.7 | 1825 | MgOss | Not confirmed | 43.24° | 0.20 |
| Experimental example 3 | 60.9 | 29.4 | 9.7 | 1825 | MgOss | $MgAl_2O_4$ MgAlON | 43.20° | 0.25 |
| Experimental example 4 | 100 | 0 | 0 | — | MgO | Not confirmed | 42.90° | |

| | Feedstock material for thermal spray (After sintering) | | | | | | Sintered body before pulverized | |
|---|---|---|---|---|---|---|---|---|
| | Particle size distribution | | Component analysis | | | | | |
| | D10 μm | D90 μm | Mg wt % | Al wt % | N wt % | Mg/(Mg + Al) Molar ratio | Etch rate μm/h | Porosity*[2] % |
| Experimental example 1 | 16 | 97 | 50.8 | 8.2 | 1.2 | 0.87 | 0.074 | <1 |
| Experimental example 2 | 16 | 99 | 46.1 | 12.7 | 1.9 | 0.80 | 0.086 | <1 |
| Experimental example 2a | 14 | 71 | 46.1 | 12.7 | 1.9 | 0.80 | 0.086 | <1 |
| Experimental example 3 | 18 | 95 | 34.7 | 23.2 | 3.2 | 0.62 | 0.097 | <1 |
| Experimental example 4 | 22 | 55 | 100.0 | 0.0 | 0.0 | — | | |

*[1]MgOss is a MgO solid solution, and MgAlON is a magnesium-aluminum oxynitride.
*[2]Porosity was measured by the Archimedean method for the sintered body before being pulverized.

(Evaluation Results of Feedstock Materials for Thermal Spray)

Figure 2:
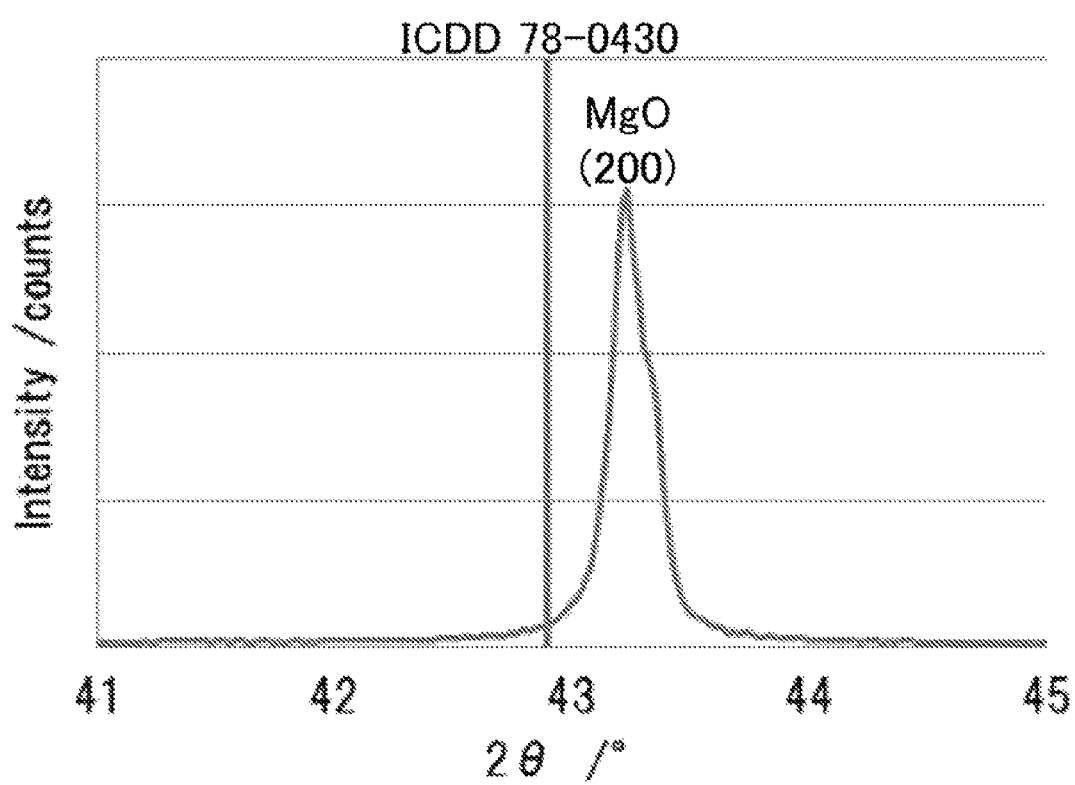
FIG. 2 is an enlarged view of the XRD peak of the feedstock material for thermal spray in Experimental Example 2.

Evaluation results of the feedstock materials for thermal spray are summarized in Table 1. It is confirmed that, in the feedstock materials for thermal spray of Experimental Examples 1 to 3, diffraction peaks are detected as main phases at the vicinity of the MgO (111) plane, (200) plane, and (220) plane which are shown in ICDD78-0430. In Experimental Examples 1 and 2, a subphase is not confirmed. In Experimental Example 3, it is confirmed that magnesium aluminum oxide (MgAl$_2$O$_4$) and magnesium-aluminum oxynitride (Mg—Al—O—N) are included as subphases. The peak of Mg—Al—O—N is observed at 2θ=47° to 49°. Taking Experimental Example 2 as a typical example, FIG. 1 shows an XRD analysis chart in Experimental Example 2, and FIG. 2 shows an enlarged view of the XRD peak in Experimental Example 2. Furthermore, Table 1 shows the peak top of the MgO (200) plane in each of Experimental Examples 1 to 4. In Experimental Examples 1 to 3, it is confirmed that the peak top of the MgO (200) plane shifts to the higher angle side than that of MgO. In the experimental examples whose XRD analysis chart is not shown this time, the peak intensity changed from that of Experimental Example 2 according to changes in the contents of the MgO solid solution, magnesium aluminum oxide, and magnesium-aluminum oxynitride. Furthermore, EPMA measurement confirms that, in the main phase region of the ceramic material before being pulverized in each of Experimental Examples 1 to 3, Al and N are detected at the same time in addition to Mg and O. It is obvious that the main phase region of the feedstock material for thermal spray obtained by pulverizing the ceramic material has the same composition.

The observation of the peak shift of the XRD peak of the MgO (200) plane to the higher angle side and the EPMA detection of Al and N at the same time in the main phase region composed of Mg and O described above show that the feedstock material for thermal spray in each of Experimental Examples 1 to 3 has, as a main phase, a crystal phase of a MgO solid solution in which aluminum and nitrogen components are dissolved with magnesium oxide. Furthermore, from the particle size distribution shown in Table 1, it is confirmed that the fluidity of the feedstock material for thermal spray is good during thermal spray.

Note that the expression "having, as a main phase, a crystal phase of a MgO solid solution" is defined as such that the ratio of the number of moles of the Mg element to the total number of moles of metal elements in the feedstock material for thermal spray (Mg/(Mg+Al) molar ratio) is 0.5 or more. In Experimental Examples 1 to 3, the (Mg/(Mg+Al) molar ratio) is 0.5 or more on the basis of the component analysis shown in Table 1.

Regarding the ceramic material before being pulverized in each of Experimental Examples 1 to 3, it is confirmed that the area fraction of the MgO solid solution phase is largest in the EPMA element mapping image obtained by EPMA measurement. It is obvious that the same applies to the feedstock material for thermal spray after pulverization. Since the area fraction of the cross section is believed to reflect the volume fraction, the fact that the area fraction of the MgO solid solution phase is largest means that the volume fraction thereof is largest.

Table 1 shows the results of the etch rate and porosity of the sintered body before pulverized into the feedstock material for thermal spray. Although not described in Table 1, the etch rate of an yttria thermal spray coating was 0.26 μm/h, and the etch rate of an alumina thermal spray coating was 0.83 μm/h. Therefore, it is evident that this sintered body has higher corrosion resistance than the yttria thermal spray coating and the alumina thermal spray coating.

Experimental Examples 1-1, 1-2, 1-3, 2-1, 2-2, 2-3, 3-1, 3-2, 4-1, 4-2, and 4-3

Thermal Spray Coating Formation

As a substrate for thermal spray, an aluminum substrate (Ra>1 μm) was prepared. Using the feedstock material for thermal spray obtained in each of Experimental Examples 1 to 3 and 2a, plasma spray was performed on the substrate for thermal spray in an air atmosphere under the conditions shown in Table 2.

In Experimental Examples 1-1, 1-2, and 1-3, the feedstock material for thermal spray of Experimental Example 1 was used. In Experimental Examples 2-1 and 2-2, the feedstock material for thermal spray of Experimental Example 2 was used. In Experimental Example 2-3, the feedstock material for thermal spray of Experimental Example 2a was used. In Experimental Examples 3-1 and 3-2, the feedstock material for thermal spray of Experimental Example 3 was used. In Experimental Examples 4-1, 4-2, and 4-3, the feedstock material for thermal spray of Experimental Example 4 was used. In the case where the feedstock materials for thermal spray of Experimental Examples 1 to 3 and 2a were used, thermal spray coatings with a thickness of 20 to 300 μm were obtained (Experimental Examples 1-1, 1-2, 1-3, 2-1, 2-2, 2-3, 3-1, and 3-2). However, in the case where the feedstock material for thermal spray of Experimental Example 4, i.e., a commercially available MgO material was used, it was not possible to obtain a thermal spray coating on the substrate even if deposition was repeated same number of times using the substantially same amount of powder supplied as that of the other Experimental Examples (Experimental Examples 4-1, 4-2, and 4-3).

(Evaluation of Thermal Spray Coating)

1) XRD Measurement

Crystal phases were identified with an X-ray diffractometer. The resulting thermal spray coating was peeled off the substrate and pulverized in a mortar into a powder. The measurement was performed under the conditions of CuKα, 40 kV, 40 mA, and 2θ=10° to 70°, using a sealed tube-type X-ray diffractometer (D8 ADVANCE, manufactured by Bruker AXS). The step width of the measurement was 0.02°. In order to determine the diffraction angle at the peak top, by adding Si standard sample powder (SRM640C) manufactured by NIST, the peak position was corrected. After confirming the detection of diffraction peaks at the vicinity of the MgO (111) plane, (200) plane, and (220) plane shown in ICDD78-0430, the position of the peak top of the diffraction angle of the MgO(200) plane of each thermal spray coating was obtained. Furthermore, the full width at half maximum of the peak of the (200) plane was calculated. The calculation was performed in the same method as that for the feedstocks for thermal spray.

2) Component Analysis

The resulting thermal spray coating was peeled off the substrate and pulverized in a mortar into a powder form, and the resulting powder was subjected to component analysis. After a sample was dissolved, analysis of each of Mg and Al was carried out by chelate titration, and analysis of N was carried out by an inert gas fusion-thermal conductivity detection technique. Although analysis of O was not carried out, it is believed that the remainder, excluding unavoidable components, such as impurities and contaminants, is substantially composed of O.

3) Corrosion Resistance Test

The surface of the resulting thermal spray coating was polished as much as possible, partially masked, and a corrosion resistance test was performed with an inductively coupled plasma (ICP) corrosion resistance tester under the conditions described below. The difference in level between the masked surface and the exposed surface, which was measured with a step gauge, was divided by the testing time to calculate the etch rate of each material.

ICP: 800 W, bias: 450 W, introduced gas: $NF_3/O_2/Ar=75/35/140$ sccm at 0.05 Torr, exposure time: 5 h, sample temperature: room temperature.

4) Water Absorption Test

In each of Experimental Examples 1-1, 2-1, and 3-1, the thermal spray coating was peeled off the substrate and kept at 30° C. and at a humidity of 95% for 4 days. Then, heating was performed to 500° C. in the air using TG-DTA, and the difference in weight before and after heating was determined. It was not possible to obtain a thermal spray coating for MgO. Thus, a MgO sintered body was obtained by press forming commercially available MgO powder, followed by heat treatment at 1,600° C., and the thickness thereof was adjusted to a thickness substantially equal to that of the thermal spray coating. This MgO sintered body was assumed as a thermal spray coating, and the difference in weight was determined by the same method. The difference in weight was divided by the area of the thermal spray coating or the area of the MgO sintered body, and the resulting value was defined as a weight loss ($mg/cm^2$), which is shown in Table 2.

5) Constituent Elements

Each thermal spray coating was mirror-polished, and detection and identification of constituent elements were performed using EPMA.

6) Porosity

By embedding each thermal spray coating in a resin (epoxy resin), pores of the thermal spray coating were filled with the resin, and then a cross section of the thermal spray coating was taken and polished. Subsequently, an SEM image of the cross section of the thermal spray coating was obtained by a scanning electron microscope (SEM). The SEM image was taken at a magnification of 500 times, as an image of 712×532 pixels. The resulting image was first converted to a 16 bit grayscale (scaling by multiplication) using image analysis software (Image-Pro Plus 7.0J by Media Cybernetics), then binarization was performed, and the porosity of the film was calculated. The threshold value for binarization was set using Otsu's binarization as a discriminant analysis method.

TABLE 2

| | Condition of plasma spray | | | Thermal spary coating | | | | | | | | | |
|---|---|---|---|---|---|---|---|---|---|---|---|---|---|
| | Cur- | Introduced gas | | Crystal phase*1 | | Peak top | Full width at half maximum | Component analysis | | | Mg/(Mg + Al) Molar | Etch rate | Weight loss | Porosity*2 |
| | rent A | Ar L/min | $H_2$ L/min | Main phase | Subphase | MgO(200) | MgO(200) | Mg wt % | Al wt % | N wt % | ratio | μm/h | $mg/cm^2$ | % |
| Experimental example 1-1 | 600 | 41 | 14 | MgOss | $MgAl_2O_4$ | 43.08° | 0.39° | 48.7 | 9.7 | 0.2 | 0.85 | 0.22 | 0.47 | 15 |
| Experimental example 1-2 | 600 | 50 | 5 | MgOss | $MgAl_2O_4$ | 43.08° | 0.34° | 49.4 | 9.1 | 0.3 | 0.86 | 0.19 | | 18 |
| Experimental example 1-3 | 600 | 53 | 2 | MgOss | $MgAl_2O_4$ | 43.08° | 0.32° | 48.3 | 9.8 | 0.2 | 0.85 | 0.16 | | 18 |
| Experimental example 2-1 | 600 | 41 | 14 | MgOss | $MgAl_2O_4$ | 43.12° | 0.55° | 43.4 | 14.6 | 0.2 | 0.77 | 0.18 | 0.45 | 9 |
| Experimental example 2-2 | 600 | 50 | 5 | MgOss | $MgAl_2O_4$ | 43.12° | 0.43° | 44.4 | 13.8 | 0.4 | 0.78 | 0.21 | | 15 |
| Experimental example 2-3 | 600 | 50 | 5 | MgOss | $MgAl_2O_4$ | 43.12° | 0.45° | 44.2 | 14.0 | 0.3 | 0.78 | 0.17 | | 9 |
| Experimental example 3-1 | 600 | 41 | 14 | MgOss | $MgAl_2O_4$ MgAlON | 43.18° | 0.29° | 31.2 | 25.2 | 0.7 | 0.58 | 0.18 | 0.20 | 16 |
| Experimental example 3-2 | 600 | 50 | 5 | MgOss | $MgAl_2O_4$ MgAlON | 43.18° | | 32.2 | 24.5 | 1.1 | 0.59 | | | |
| Experimental example 4-1 | 600 | 41 | 14 | Thermal spray coating was not obtained | | | | | | | | | 1.5*3 | |
| Experimental example 4-2 | 600 | 50 | 5 | Same as above | | | | | | | | | | |
| Experimental example 4-3 | 600 | 55 | 0 | Same as above | | | | | | | | | | |

*1MgOss is a MgO solid solution, and MgAlON is a magnesium-aluminum oxynitride.
*2Porosity was calculated from SEM photograph by image processing.
*3Value determined assuming a MgO sintered body as a thermal spray coating.

(Evaluation Results of Thermal Spray Coatings)

Figure 3:
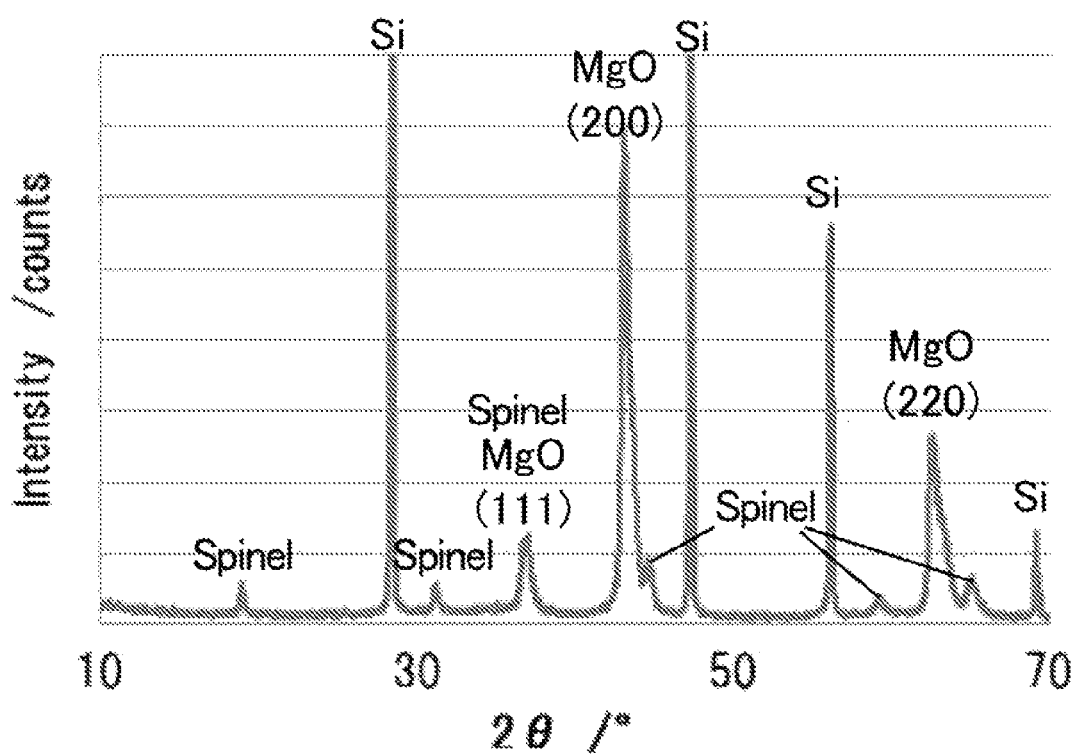
FIG. 3 is an XRD analysis chart of a thermal spray coating in Experimental Example 2-1.
Figure 4:
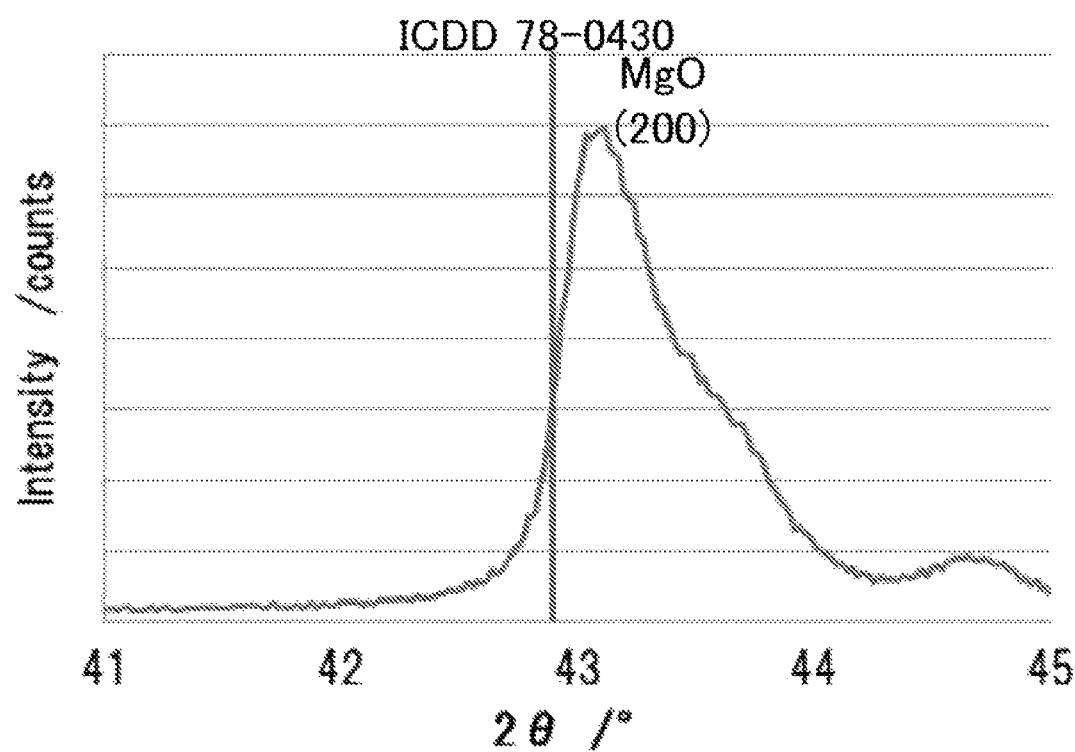
FIG. 4 is an enlarged view of the XRD peak of the thermal spray coating in Experimental Example 2-1.

Evaluation results of the thermal spray coatings are summarized in Table 2. It is confirmed that, in the thermal spray coatings of Experimental Examples 1-1, 1-2, 1-3, 2-1, 2-2, 2-3, 3-1, and 3-2, diffraction peaks are detected as main phases at the vicinity of the MgO (111) plane, (200) plane, and (220) plane which are shown in ICDD78-0430. It is also confirmed that, in each of the thermal spray coatings, magnesium aluminum oxide ($MgAl_2O_4$) is included as a subphase, and in the thermal spray coatings of Experimental Examples 3-1 and 3-2, magnesium-aluminum oxynitride is included as a subphase in addition to the magnesium aluminum oxide. As typical examples, FIG. 3 shows an XRD analysis chart in Experimental Example 2-1, and FIG. 4 shows an enlarged view of the XRD peak in Experimental Example 2-1. In the experimental examples whose XRD analysis chart is not shown this time, the peak intensity varied according to changes in the contents of the MgO solid solution, magnesium aluminum oxide, and magnesium-aluminum oxynitride compared with Experimental Example 2-1. It is confirmed from Table 2 that, in Experimental Examples 1-1, 1-2, 1-3, 2-1, 2-2, 2-3, 3-1, and 3-2, the peak top of the MgO (200) plane shifts to the higher angle side than that of MgO. Furthermore, EPMA measurement confirms that the main phase region is composed of Mg and O, and Al and N are detected at the same time.

Regarding the full width at half maximum of MgO (200) of each of the thermal spray coatings, in the thermal spray coatings produced from the same feedstock material for thermal spray, there observed a tendency that as the amount of $H_2$ introduced increases, the full width at half maximum increases and crystallinity decreases. That is, when comparison is made among Experimental Examples 1-1, 1-2, and 1-3, in Experimental Example 1-1 in which the amount of $H_2$ introduced is large, the full width at half maximum is large and crystallinity is low. When comparison is made between Experimental Examples 2-1 and 2-2, in Experimental Example 2-1 in which the amount of $H_2$ introduced is large, the full width at half maximum is large and crystallinity is low.

Furthermore, the porosity of the thermal spray coating is 15% in Experimental Example 1-1, 18% in each of Experimental Examples 1-2 and 1-3, 9% in Experimental Example 2-1, 15% in Experimental Example 2-2, 9% in Experimental Example 2-3, and 16% in Experimental Example 3-1.

The observation of the peak shift of the XRD peak of the MgO (200) plane to the higher angle side and the EPMA detection of Al and N at the same time in the main phase region composed of Mg and O described above show that the thermal spray coating in each of Experimental Examples 1-1, 1-2, 2-1, 2-2, 3-1, and 3-2 has, as a main phase, a crystal phase of a MgO solid solution in which aluminum and nitrogen components are dissolved with magnesium oxide. Note that the expression "having, as a main phase, a crystal phase of a MgO solid solution" is defined as such that the Mg/(Mg+Al) molar ratio is 0.5 or more as described above. As is clear from the component analysis in Table 2, the Mg/(Mg+Al) molar ratio is 0.5 or more in each of Experimental Examples 1-1, 1-2, 2-1, 2-2, 3-1, and 3-2. Furthermore, the main phase region had the largest area in EPMA.

Table 2 shows the resulting etch rate of the thermal spray coating in each of Experimental Examples 1-1, 1-2, 2-1, 2-2, and 3-1. Although not described in Table 2, the etch rate of an yttria thermal spray coating was 0.26 μm/h, and the etch rate of an alumina thermal spray coating was 0.83 μm/h. Therefore, it is evident that this thermal spray coating has higher corrosion resistance than the yttria thermal spray coating and the alumina thermal spray coating.

Furthermore, when comparison was made between the etch rate and the full width at half maximum regarding the sintered body before being pulverized into the feedstock for thermal spray in Experimental Example 1 and the thermal spray coatings produced from the feedstock for thermal spray in Experimental Examples 1-1, 1-2, and 1-3, there was a tendency that as the full width at half maximum decreased, the etch rate decreased. For the thermal spray coatings in these experimental examples, there is no large difference in the porosity of the film, at 15% to 18%, and there is substantially no difference in the Mg/(Mg+Al) molar ratio of the thermal spray coating. Consequently, the influence of the porosity and the composition of the film on the etch rate can be considered to be at the same level. Therefore, in the thermal spray coatings in these experimental examples, it can be considered that the crystallinity of the coating, other than the porosity and the composition of the coating, relates to the plasma durability. That is, it can be considered that a material having a smaller full width at half maximum of MgO (200) and higher crystallinity exhibits higher plasma durability. The same tendency was observed regarding the sintered body before being pulverized into the feedstock material for thermal spray of Experimental Example 3 and the thermal spray coating of Experimental Example 3-1 produced from the feedstock material for thermal spray coating. On the other hand, regarding the thermal spray coatings of Experimental Examples 2-1 and 2-2 produced from the feedstock material for thermal spray of Experimental Example 2, the etch rate is lower and the corrosion resistance was higher in Experimental Example 2-1. In these cases, it is assumed that, because of a large difference in the porosity, i.e., 9% and 15%, the size of porosity, rather than the full width at half maximum (crystallinity), largely influenced the etch rate. Regarding Experimental Examples 2-1 and 2-3, the etch rate is lower in Experimental Example 2-3. When these two are compared, the porosity of the film is same at about 9%, there is substantially no difference in the Mg/(Mg+Al) molar ratio of the thermal spray coating, and Experimental Example 2-3 has a smaller full width at half maximum of MgO (200) and higher crystallinity. Therefore, the reason for the higher plasma durability of Experimental Example 2-3 is considered to be that crystallinity is higher. Consequently, in the case of thermal spray coatings produced from the same feedstock material for thermal spray, it can be considered that as the full width at half maximum of MgO (200) decreases and crystallinity increases, plasma durability increases. Among the thermal spray coatings produced from the feedstock material for thermal spray of Experimental Example 1, the thermal spray coating of Experimental Example 1-3 has the highest plasma durability. Among the thermal spray coatings produced from the feedstock material for thermal spray of Experimental Example 2, the thermal spray coating of Experimental Example 2-3 has the highest plasma durability. Among the thermal spray coatings produced from the feedstock material for thermal spray of Experimental Example 3, the thermal spray coating of Experimental Example 3-1 has the highest plasma durability. Furthermore, the plasma durability of an alumina thermal spray coating is lower than that of the thermal spray coatings (as described above, the etch rate of the alumina thermal spray coating was 0.83 μm/h). When all of these are compared, the size of plasma durability is expressed by the relationship: Experimental Example 1-3>Experimental Example 2-3>Experimental Example 3-1>alumina thermal spray coating, although the porosity varies. Furthermore, in the sintered bodies before being pulverized into feedstock materials for thermal spray, the size of plasma durability is expressed by the relationship: Experimental Example 1>Experimental Example 2>Experimental Example 3. Therefore, it can be considered that as the Al content decreases and the Mg content increases in the film, i.e., the Mg/(Mg+Al) molar ratio increases, plasma durability increases.

Table 2 shows the weight loss per area ($mg/cm^2$) obtained by TG-DTA measurement. The weight loss in each of Experimental Examples 1-1, 2-1, and 3-1 is smaller than 1.5 $mg/cm^2$ which is the weight loss of the MgO sintered body. Therefore, it is evident that this thermal spray coating has lower water absorption than MgO.

As described above, as the Mg content in the film increases, plasma durability increases, and as the Mg content in the film decreases, water absorption decreases. In the case where semiconductor manufacturing equipment requires higher plasma durability while maintaining low water absorption, a thermal spray coating having a large Mg content can be selected. In the case where semiconductor manufacturing equipment requires lower water absorption while maintaining high plasma durability, a thermal spray coating having a small Mg content can be selected.

The present application claims priority of Japanese Patent Application No. 2013-252766 filed on Dec. 6, 2013 and Japanese Patent Application No. 2014-109328 filed on May 27, 2014, the entire contents of which are incorporated herein by reference.

The present invention is not limited to the above-described embodiment. It is clear that the present invention can be implemented in a variety of embodiments without departing from the technical scope thereof.

What is claimed is:

1. A thermal spray coating comprising magnesium, aluminum, oxygen, and nitrogen and having, as a main phase, a crystal phase of a MgO—AlN solid solution in which aluminum nitride is dissolved with magnesium oxide.

2. The thermal spray coating according to claim 1, wherein the XRD peak of the MgO (200) plane measured with CuKα radiation shifts to a higher angle side with respect to $2\theta=42.90°$, which corresponds to the peak of the cubic crystal of magnesium oxide.

3. The thermal spray coating according to claim 1, wherein the full width at half maximum of the XRD peak of the MgO (200) plane measured with CuKα radiation is 0.55° or less.

4. The thermal spray coating according to claim 1, wherein, in component analysis of the thermal spray coating, the Mg/(Mg+Al) molar ratio is 0.58 or more.

5. The thermal spray coating according to claim 1, wherein the thermal spray coating contains, as a subphase, a magnesium aluminum oxide.

6. The thermal spray coating according to claim 1, wherein the thermal spray coating contains, as a subphase, a magnesium-aluminum oxynitride phase whose XRD peak measured with CuKα radiation appears at, at least, $2\theta=47°$ to $49°$.

7. The thermal spray coating according to claim 1, wherein the full width at half maximum of the XRD scale of the MgO (200) plane measured with CuKα radiation is 0.55° or less.

8. The thermal spray coating according to claim 1, wherein the thermal spray coating has an open porosity of 20% or less.

9. The thermal spray coating according to claim 1, wherein a nitrogen content in the thermal spray coating is less than 1.1 wt %.

10. A member for semiconductor manufacturing equipment whose surface is covered with the thermal spray coating according to claim 1.

* * * * *